(12) United States Patent
Shum

(10) Patent No.: US 6,307,781 B1
(45) Date of Patent: Oct. 23, 2001

(54) TWO TRANSISTOR FLASH MEMORY CELL

(75) Inventor: Danny Pak-Chum Shum, Poughkeepsie, NY (US)

(73) Assignee: Infineon Technologies Aktiengesellschaft, Munich (DE)

(*) Notice: Subject to any disclaimer, the term of this patent is extended or adjusted under 35 U.S.C. 154(b) by 0 days.

(21) Appl. No.: 09/410,119

(22) Filed: Sep. 30, 1999

(51) Int. Cl.$^7$ ...................................... G11C 16/04
(52) U.S. Cl. ............................ 365/185.17; 365/185.28
(58) Field of Search ...................... 365/185.17, 185.01, 365/185.14, 185.18, 185.19, 185.26, 185.28

(56) References Cited

U.S. PATENT DOCUMENTS

| | | | |
|---|---|---|---|
| 5,751,631 | * 5/1998 | Liu et al. | 365/185.01 |
| 5,814,854 | * 9/1998 | Liu et al. | 257/315 |
| 5,867,425 | * 2/1999 | Wong | 365/185.08 |
| 5,872,732 | * 2/1999 | Wong | 365/185.18 |
| 5,953,254 | * 9/1999 | Pourkeramati | 365/185.26 |
| 5,978,267 | * 11/1999 | Chen et al. | 365/185.17 |
| 6,060,742 | * 5/2000 | Chi et al. | 257/316 |
| 6,091,634 | * 7/2000 | Wong | 365/185.14 |
| 6,091,635 | * 7/2000 | Chi et al. | 365/185.18 |
| 6,091,636 | * 7/2000 | Liu et al. | 365/185.19 |

* cited by examiner

Primary Examiner—Richard Elms
Assistant Examiner—Anh Phung
(74) Attorney, Agent, or Firm—Stanton C. Braden

(57) ABSTRACT

A two transistor cell NOR architecture flash memory is provided wherein the floating gate transistor is couple between the selection transistor and an associated bit line. The flash memory is deposited within a triple well and operates according to a Fowler-Nordheim tunnel mechanism. Programming of memory cells involves tunneling of carriers through gate oxide from a channel region to a floating gate rather than tunneling from a drain or source region to the floating gate.

4 Claims, 2 Drawing Sheets

TWO TRANSISTOR FLASH MEMORY CELL

BACKGROUND OF THE INVENTION

Flash memory cells have enjoyed recent commercial success due to their relatively low cost, the ease in erasing information stored in a flash memory array and their applications to bank check cards, credit cards, and the like. A flash memory cell which is recognized by the semiconductor industry as a standard has not yet emerged. Many types of flash memories exist which embody many different architectures. The programming, reading and erasing of cells can be generally described under one of the following architectures-NOR, AND, or NAND. Further, the programming mechanism of the flash memory cell typically involves Fowler-Nordheim tunneling through an energy barrier or electron injection over an energy barrier.

The array erase mechanism for Fowler-Nordheim cells can involve floating gate to channel, floating gate to drain or floating gate to source as the charge clearing path from the floating gate. The floating gate to drain or source path can prove deleterious to cell operation by destroying the tunnel oxide area located between the floating gate overlap and the drain/source region. On the other hand the tunnel oxide can also be destroyed through the programming mechanisms (e.g., programming a logic one or logic zero on the floating gate) of conventional Fowler-Nordheim flash cells. These programming mechanisms can include charge carrier paths between the floating gate and drain or alternatively between the floating gate and source. However, conventional cells do not include a programming operation involving a path between the channel and floating gate. Such an operation would be desirable from a standpoint of limiting tunnel oxide degradation due to the field re-distribution effect across the entire tunnel oxide region. Until now, a flash memory cell which allows uniform channel programming has not existed.

DETAILED DESCRIPTION OF THE INVENTION

Figure 1:
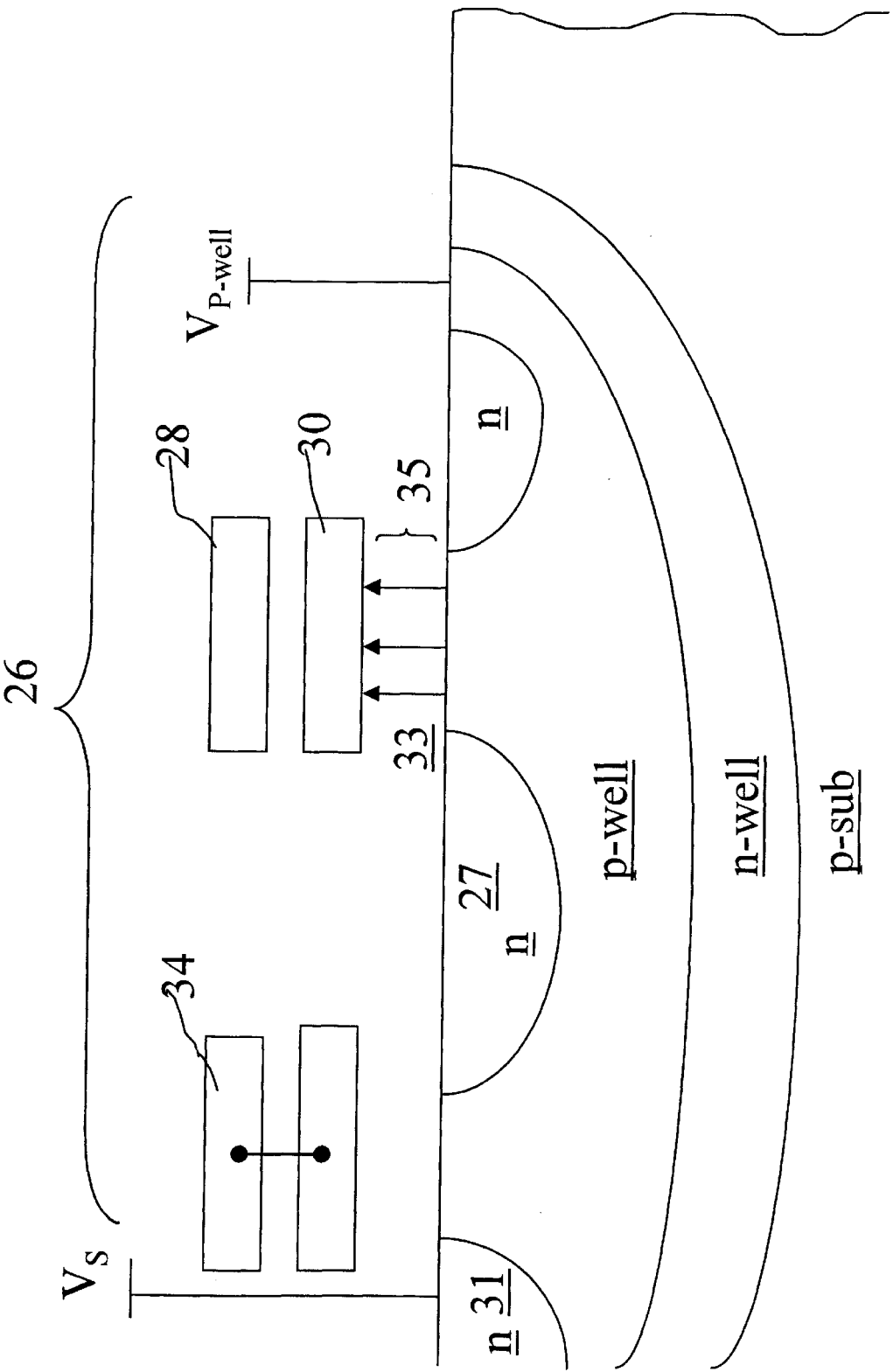
FIG. 1 illustrates a partial schematic/partial cross-sectional view of the flash memory cell according to the invention.
Figure 2:
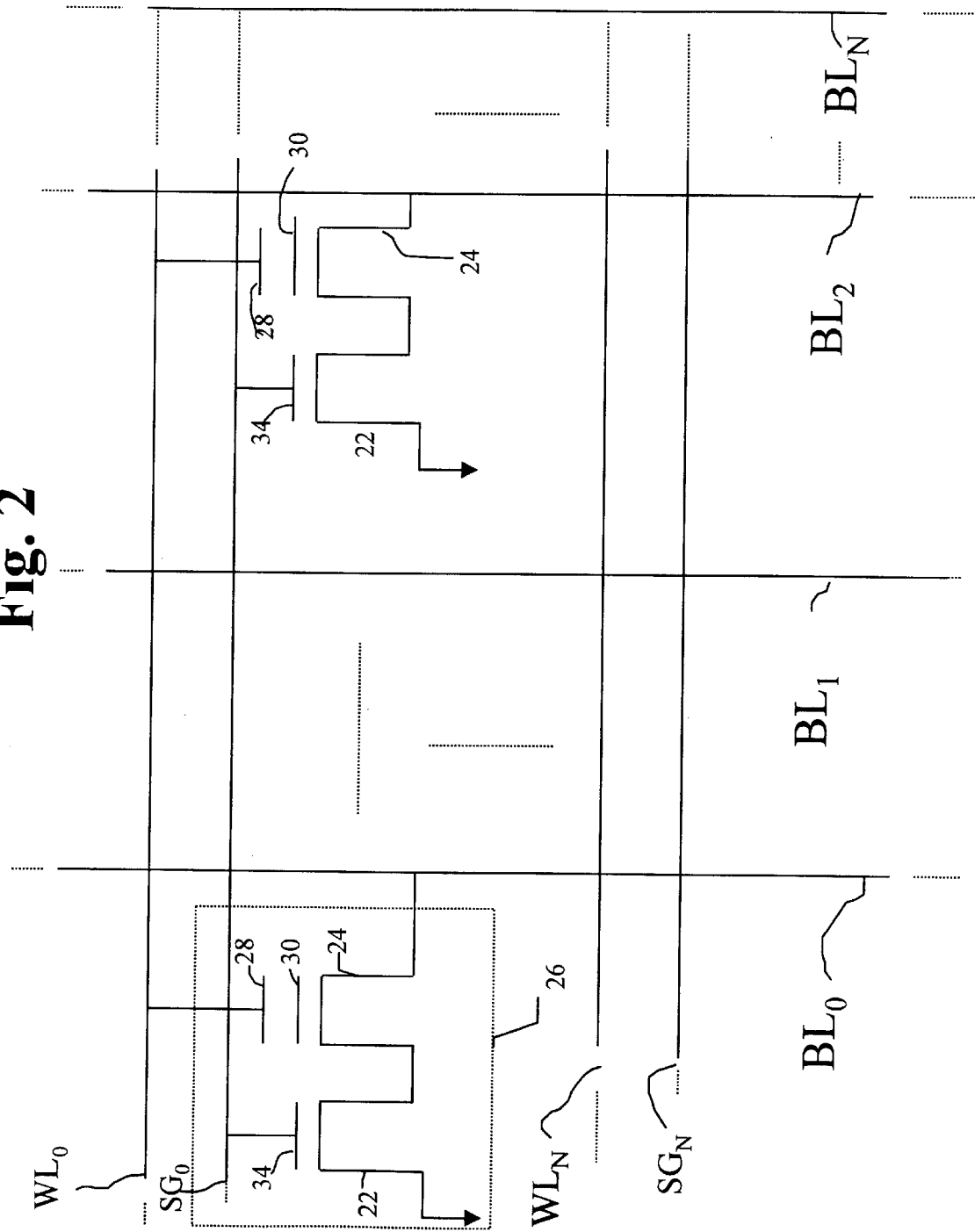
FIG. 2 illustrates a schematic drawing of a NOR architecture flash memory cell array according to the invention. Reference numerals have been carried forward from FIG. 1.

FIG. 1 illustrates a partial schematic/partial cross-sectional view of the flash memory cell according to the invention. This cell may be constructed according to fabrication methods combining triple well formation with dual gate technology. As shown, flash memory cell 26 is fabricated in a triple-well comprising a first well region (labeled here as p-weUl), a second well region (labeled here as n-well) and a third well or substrate region (labeled here as psub). The conductivity type (e.g., n-type or p-type) will change according to the field effect transistor being fabricated for the cell. The foregoing conductivity types correspond to n-channel devices. Opposite conductivity types to those named would be used with p-channel devices. Drain region 27 is shared within cell 26 by the selection transistor, which is formed in part by gate 34, and the floating gate transistor, which is formed in part by floating gate 30. Source region 31 serves as the source region for the selecton gate transistor while source region 33 serves as the source region for the floating gate transistor. FIG. 2 illustrates a schematic drawing of a NOR architecture flash memory cell array according to the invention. Selection transistor 22 shares a drain region with and is connected to floating gate transistor 24. Transistors 22 and 24 together comprise memory cell 26. Gate 34 of selection transistor 22 is connected to selection gate line $SG_0$ while control gate 28 of floating gate transistor 24 is connected to word line $WL_0$. Cell operation for flash memory cell 26 is as follows:

Programming:

To program a cell, such as cell 26, the associated bit line is toggled low (typically −3 volts) while the associated word line is toggled strongly high. Unselected cells sharing the same word line as the selected cell are subject to a phenomenon known as gate disturb, where the unselected cell could be unintentionally programmed. However, with the full voltage swing of opposite polarity between the selected bit line and unselected bit line make this situation less likely.A typical strong high voltage for the selected wordline for this application is around 12 to 13 volts. Selection gates (SG) for the memory array are held at a low level, typically −3 volts. Unselected bit lines remain at a high level, e.g around 3 to 4 volts. The bias of the p-well region, $V_{p\text{-}well}$ for transistor 22 is held at a low voltage (e.g. −3 volts) while the source voltage $V_s$ for the selection transistor 22 is left floating. Unselected cells which are associated with the bit line of a selected cell, such as $BL_0$ of cell 26 are subject to a phenomenon known as drain disturb wherein one of these unselected cells is programmed. However, the strong program voltage (i.e. 12 volts) generally required for programming makes this situation less likely. In connection with programming, a depletion mode transistor is turned off (programmed off or made to store a logic low level voltage) by carriers which (with reference to FIG. 1) tunnel in the direction of arrows 35 through a Fowler-Nordheim mechanism to floating gate 30. Note that tunneling through gate oxide 33 occurs from the channel region to the floating gate, rather than from a drain or source region to the floating gate. This particular tunnel mechanism helps prevent the destruction of the tunnel oxide as discussed in the foregoing section concerning prior art devices. The foregoing voltage characterizations apply to n-channel transistors. Opposite voltage levels (e.g. low instead of high, etc.) apply to p-channel transistors.

Erasing:

With reference to FIGS. 1 and 2, to erase a cell, such as cell 26, the associated bit line is left high (e.g. 3 volts) as is VS, the source bias voltage of selection transistor 22. Gate 34 of selection transistor 22 is toggled high (e.g. 3 volts over the circuit supply voltage) along with the bias of the p-well, Vp,W, .(e.g. 3 volts). Control gates 28 of unselected cells are toggled low (the circuit supply voltage). Control gate 28 of the selected cell 26 is toggled to a strong low, level, e.g around −12 to −14 volts. $V_{p\text{-}Well}$ is maintained at a high level (e.g. 3 volts). A phenomenon known as erase disturb wherein unselected cells are erased could occur. However, due the relatively strong negative voltage (e.g. −12 volts) used to erase a cell, this is less likely.

Reading:

With reference to FIGS. 1 and 2, in order to read the contents of a selected memory cell 22, selection gate 34 of transistor 22 within cell 28 is toggled high (e.g., the circuit supply voltage) along with the associated bit line $BL_0$ (e.g. 1.5 volts) of selected cell 26. Unselected bit lines are biased low (e.g., circuit ground) Likewise voltage $V_{p\text{-}well}$, the p-well voltage is biased low (at circuit ground.) $V_s$ is also maintained low (i.e., circuit ground). Selection gate 34 of unselected bit lines are pulled low. Control gates 28 are pulled low (e.g., circuit ground) during a read operation. Bi line disturb could occur along cells associated with $BL_0$. Additionally gate disturb could occur along cells associated with cells having the same selection gate line as the selected cell. The use of the circuit supply voltage in the former case involving gate disturb and the low voltages used involving the latter case make these situations unlikely.

The chart below summarizes the foregoing described cell scenarios: Note that selection lines are operable to carry voltages capable of turning transistor 22 on or off, thus selecting a cell.

the voltage dropped across this dielectric thickness, e.g. tunnel oxide 33). 11 volts across 100 Å tunnel oxide 33 of FIG. 1 provides an $E_k=1.1*1^7$ V/cm. By contrast, an 8.4 voltage across the tunnel oxide for a non-triple well structure in the example above, provides an E=0.84*107 V/cm. Consequently, this $E_k$ is in sufficient to cause tunneling, thusly, herein lies an advantage of the triple well structure.

Another primary benefit of the triple well structure is that it allows scaling of the memory cell. Decreases in the size of the cell can include an attendant decrease in bias voltages, independent of the supply voltage. Structures without a triple well are penalized in that scaling is limited by the supply voltage since some minimum supply voltage will be

|  | Transistor State | Bit line $BL_0$ (volts) | $V_s$ (volts) | $V_p$ (well) (volts) | Control Gate (volts) (28) | Selection Transistor Gate (volts) (34) |
|---|---|---|---|---|---|---|
| PROGRAM |  |  |  |  |  |  |
| Selected Cell | Transistor 22-off | −3 | floating | −3 | +12 to +13 | −3 |
| Non Selected Cell (Possible-unlikely gate disturb) | Transistor 22-off | +3 to +4 | Floating | −3 | +12 to +13 | −3 |
| Non Selected Cell (Possible-unlikely bitline disturb) | Transistor 22-off | −3 | Floating | −3 | 0 to −3 | −3 |
| ERASE |  |  |  |  |  |  |
| Selected Cell | Transistor 22-on | +3 | +3 | +3 | −12 to −14 | Supply voltage +3 |
| Non Selected Cell (Possible-unlikely gate disturb) | Transistor 22-on | +3 | +3 | +3 | 0 to +3 | Supply voltage +3 |
| READ |  |  |  |  |  |  |
| Selected Cell | Transistor 22-on | +1.5 | 0 | 0 | 0 | Circuit supply |
| Non Selected Cell (Possible-unlikely gate disturb) | Transistor 24-off | 0 | 0 | 0 | 0 | Circuit supply |
| Non Selected Cell (Possible-unlikely bitline disturb) | Transistor 22-off | +1.5 | 0 | 0 | 0 | 0 |

Benefits of the Well:

A primary advantage of the invention is provided by the triple well structure. In view of the 70% cell coupling, which is typical in this art, the forgoing described programming biasing scheme involving 12 to 13 volts on the control gate and −3 volts on the p-well ($V_B$=−3 volts) results in approximately 11 volts across a 100 Å tunnel oxide 33 as shown in FIG. 1. A structure with 12 volts on the control gate but without the negatively biased substrate (e.g., a substrate voltage of 0 volts at region 33) ( e.g., a non-triple well structure) would only develop 8.4 volts across tunnel oxide 33 of FIG. 1. It has been shown, and is well known, that electron tunneling is an extremely sensitive function of the capacitor cathode electric field and that electron tunneling requires a cathode electric field, $Ek=V_{tx}/T_{tx}$, of at least $10^7$ V/cm (where $T_{tx}$ is the tunnel dielectric thickness and $V_{tx}$ is required for proper functioning of periperal circuitry, e.g. sense amps, etc. The foregoing triple well benefits are in additon to the beneficial effects of the tunnel mechanism which prevents destruction of the tunnel oxide as previously mentioned.

Although the invention has been described in detail herein with reference to preferred embodiments and certain described alternatives, it is to be understood that this description is by way of example only, and it is not to be construed in a limiting sense. It is to be further understood that numerous changes in the details of the embodiments of the invention and additional embodiments of the invention, will be apparent to, and may be made by, persons of ordinary skill in the art having reference to this description. It is contemplated that all such changes and additional embodiments are within the spirt and true scope of the invention as claimed below.

I claim:

1. A flash memory comprising:
an array, having a NOR architecture, of selection gate lines, wordlines, bit lines and a plurality of memory cells, each said memory cell comprising a floating gate transistor connected to a selection transistor, said floating gate transistor being operable to couple said selection gate transistor to an associated cell bit line according to a method whereby carriers tunnel through gate oxide of the floating gate transistor from a channel region to the floating gate , each said memory cell being formed within a triple well including a first well of a first conductivity type within a second well of a second conductivity type within a third well of said first conductivity type.

2. A flash memory as recited in claim 1 wherein each floating gate transistor includes a tunnel oxide disposed between a floating gate and channel region of said floating gate transistor and wherein an electric field of at least $1.1*1^7$ V/cm is developed across said tunnel oxide of a selected cell in connection with cell programming.

3. A flash memory cell as recited in claim 1 wherein selected cells of said memory are programmed using positive voltages with respect to a circuit ground on their control gates.

4. A flash memory comprising:
an array, having a NOR architecture, of selection gate lines, wordlines, bit lines and a plurality of n-channel memory cells, each said memory cell comprising a floating gate transistor connected to a selection transistor, said floating gate transistor being operable to couple said selection gate transistor to an associated cell bit line according to a method whereby carriers tunnel through gate oxide of the floating gate transistor from a channel region to the floating gate , each said memory cell being formed within a triple well including a first well of a first conductivity type within a second well of a second conductivity type within a third well of said first conductivity type.

* * * * *